United States Patent
Bour et al.

(10) Patent No.: US 7,276,390 B2
(45) Date of Patent: Oct. 2, 2007

(54) LONG WAVELENGTH INDIUM ARSENIDE PHOSPHIDE (INASP) QUANTUM WELL ACTIVE REGION AND METHOD FOR PRODUCING SAME

(75) Inventors: David P. Bour, Cupertino, CA (US); Michael R. T. Tan, Menlo Park, CA (US); William H. Perez, San Jose, CA (US)

(73) Assignee: Avago Technologies General IP Pte Ltd, Singapore (SG)

( * ) Notice: Subject to any disclaimer, the term of this patent is extended or adjusted under 35 U.S.C. 154(b) by 764 days.

(21) Appl. No.: 10/230,895

(22) Filed: Aug. 29, 2002

(65) Prior Publication Data
US 2004/0043523 A1    Mar. 4, 2004

(51) Int. Cl.
*H01L 21/205* (2006.01)
(52) U.S. Cl. .......................... 438/46; 438/483
(58) Field of Classification Search .......... 438/20, 438/603–604, 605, 606, 681
See application file for complete search history.

(56) References Cited

U.S. PATENT DOCUMENTS 5,493,577 A * 2/1996 Choquette et al. .......... 372/46
2002/0014674 A1 * 2/2002 Hideyoshi et al. .......... 257/458
2002/0041613 A1 * 4/2002 Yoshida et al. .............. 372/46
2003/0008426 A1 * 1/2003 Kise et al. ................... 438/22

OTHER PUBLICATIONS

Wei-Han Wang et al The Influence of Rapid Thermal Annealing on InAsP/InP Strained Multiple Quantum Well Laser Diodes Grown by Metalorganic Vapor Phase Epitaxy Compound Semiconductors 2000 IEEE international Symposium, publication date Oct. 2000.*
Article entitled "1.55µm InAsP/InGaAsP Strained Multiple-Quantum-Well Laser Diodes Grown by Solid-Source Molecular Beam Epitaxy" by Zhi-Biao Hao, et al.; Jpn. J. Appl. Phys. vol. 41 (2002) pp. 754-757, Part I, No. 2A, Feb. 2002; § 2002 The Japan Society of Applied Physics.

* cited by examiner

*Primary Examiner*—Stephen W. Smoot

(57) ABSTRACT

An InAsP active region for a long wavelength light emitting device and a method for growing the same are disclosed. In one embodiment, the method comprises placing a substrate in an organometallic vapor phase epitaxy (OMVPE) reactor, the substrate for supporting growth of an indium arsenide phosphide (InAsP) film, forming a quantum well layer of InAsP, and forming a barrier layer adjacent the quantum well layer, where the quantum well layer and the barrier layer are formed at a temperature of less than 520 degrees C. Forming the quantum well layer and the barrier layer at a temperature of less than 520 degrees C. results in fewer dislocations by suppressing relaxation of the layers. A long wavelength active region including InAsP quantum well layers and InGaP barrier layers is also disclosed.

12 Claims, 6 Drawing Sheets

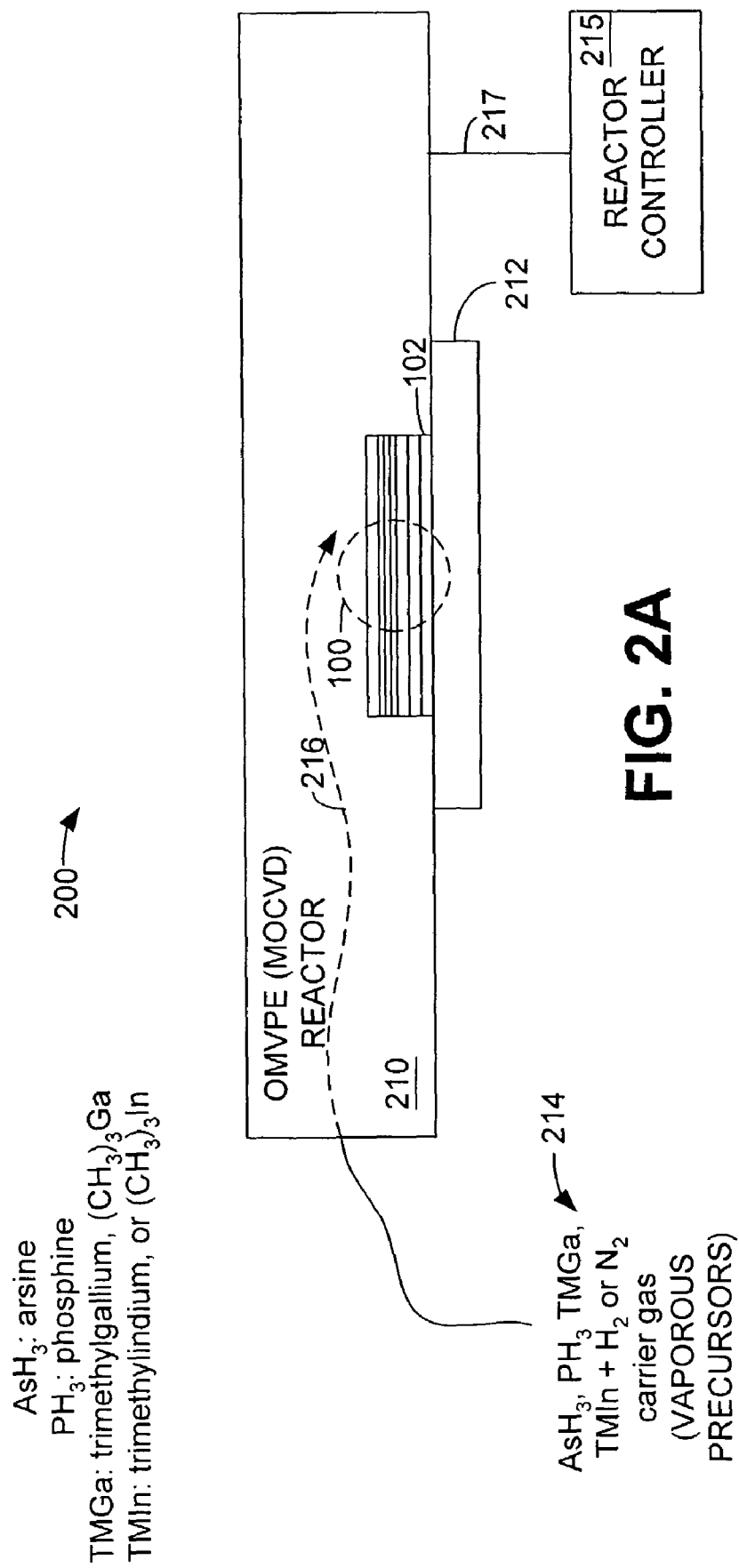

LONG WAVELENGTH INDIUM ARSENIDE PHOSPHIDE (INASP) QUANTUM WELL ACTIVE REGION AND METHOD FOR PRODUCING SAME

TECHNICAL FIELD

The invention relates generally to light emitting devices, and, more particularly, to an indium arsenide phosphide (InAsP) quantum well active region for a long wavelength light emitting device and a method for producing same.

BACKGROUND OF THE INVENTION

Light emitting devices are used in many applications including optical communication systems. Optical communication systems have been in existence for some time and continue to increase in use due to the large amount of bandwidth available for transporting signals. Optical communication systems provide high bandwidth and superior speed and are suitable for efficiently communicating large amounts of voice and data over long distances. Optical communication systems that operate at relatively long wavelengths on the order of 1.3 micrometers ($\mu m$) to 1.55 $\mu m$ are generally preferred because optical fibers generally have their lowest attenuation in this wavelength range. These long wavelength optical communication systems include a light source capable of emitting light at a relatively long wavelength. Such a light source can be, for example, a vertical-cavity surface-emitting laser (VCSEL), an edge-emitting laser, or other types of light sources.

These light sources include an active region into which carriers, i.e., electrons and holes, are injected. The holes and electrons recombine in the active region and emit coherent light at a particular wavelength. One manner of forming an active region in a light emitting device is to form a quantum well layer and sandwich the quantum well layer between a pair of adjacent barrier layers. The quantum well layer and the adjacent barrier layers form what is referred to as a quantum well. The quantum well layer typically comprises a low bandgap semiconductor material, while the barrier layers typically have a bandgap higher than the bandgap of the quantum well layers. In this manner, when the laser diode is subject to forward bias, electrons and holes are injected into and trapped in the quantum well layer and recombine to emit coherent light at a particular wavelength. Generally, more than one quantum well is formed in a light emitting device. The optimum number of quantum wells is dependent upon the material system from which the quantum wells are grown and on the required optical gain A light emitting device has a threshold current ($I_{th}$), which is the current at which lasing action begins. The relationship between temperature and threshold current of a light emitting device is exponential, and can be characterized by the formula $I_{th} \propto \exp T/T_0$, where $T_0$ is the characteristic temperature of the light emitting device.

A quantum well layer for a 1.5 $\mu m$ wavelength light emitting device can be formed using indium gallium arsenide phosphide (InGaAsP), which can be formed over an indium phosphide (InP) substrate. Unfortunately, for a conventional light emitting device having an InGaAsP quantum well layer, the value of $T_0$ is small, resulting in a rapid increase in the value of $I_{th}$ when temperature rises. This occurs mainly due to Auger recombination and carrier leakage, as known to those skilled in the art. Therefore, InGaAsP quantum well layers are not particularly well suited for 1.5 $\mu m$ wavelength output light emitting devices in which a low threshold current and high characteristic temperature are desired.

A quantum well layer for a 1.3 $\mu m$ wavelength light emitting device can be formed using InAsP, which can be formed over an indium phosphide (InP) substrate, and which has a higher characteristic temperature, $T_0$, than InGaAsP. Depending on the arsenic fraction of a quantum well layer formed using InAsP, the operating wavelength of a light emitting device can be extended to approximately 1.3 $\mu m$. However, it would be desirable to extend the wavelength in which an InAsP quantum well layer generates photons to approximately 1.5 $\mu m$. Obtaining such an output wavelength from an InAsP quantum well layer suggests that the arsenic fraction in the InAsP layer approach 60%. Unfortunately, when using conventional processing techniques, such an arsenic fraction results in a significant lattice mismatch when the InAsP is grown over InP. The lattice mismatch can approach 2%. Thus, the InAsP quantum well layers are highly strained. These highly strained quantum well layers may relax during, or after their formation, thereby resulting in the formation of dislocations in the InAsP layer. Dislocations are stress fractures in the epitaxial film and can degrade the optical performance of the material by destroying the material's luminescence efficiency, sometimes referred to as photoluminescence intensity, thereby making the material unacceptable for use in a light emitting device.

Forming an InAsP layer is possible using a technique known as organometallic vapor phase epitaxy (OMVPE), sometimes referred to as metal organic chemical vapor deposition (MOCVD). OMVPE uses liquid or solid chemical precursors, through which a carrier gas is passed, to generate a chemical vapor that is passed over a heated semiconductor substrate located in a reactor. Conditions in the reactor are controlled so that the combination of vapors forms an epitaxial film as the vapors pass over the substrate. OMVPE is an economical and well established technology for growing epitaxial films.

Unfortunately, as mentioned above, growing high optical quality InAsP is difficult because, when using conventional growth parameters, the arsenic fraction required for light emission at 1.5 $\mu m$ results in dislocations in the epitaxial material sufficient to render the material unusable for a light emitting device.

Therefore, it would be desirable to economically mass produce a long-wavelength light emitting device having an InAsP quantum well layer using OMVPE.

SUMMARY OF THE INVENTION

Embodiments of the invention provide several methods for using OMVPE to grow high quality, long wavelength light emitting active regions. In one embodiment, the invention is a method for producing an active region for a long wavelength light emitting device, comprising placing a substrate in an organometallic vapor phase epitaxy (OMVPE) reactor, the substrate for supporting growth of an indium arsenide phosphide (InAsP) film, forming a quantum well layer of InAsP, and forming a barrier layer adjacent the quantum well layer, where the quantum well layer and the barrier layer are formed at a temperature of less than 520 degrees C. Forming the quantum well layer and the barrier layers at a temperature of less than 520 degrees C. results in fewer dislocations by suppressing relaxation of the layers.

Other features and advantages in addition to or in lieu of the foregoing are provided by certain embodiments of the invention, as is apparent from the description below with reference to the following drawings.

BRIEF DESCRIPTION OF THE DRAWINGS

The invention, as defined in the claims, can be better understood with reference to the following drawings. The components within the drawings are not necessarily to scale relative to each other, emphasis instead being placed upon clearly illustrating the principles of the present invention.

FIG. 2A is a schematic diagram illustrating an OMVPE reactor in which a laser including the active region of FIG. 1B can be grown.

DETAILED DESCRIPTION OF THE INVENTION

While described below using an example of an edge emitting laser that incorporates InAsP quantum well layers, other device structures can benefit from the invention. For example, a vertical-cavity surface-emitting laser (VCSEL) including high quality InAsP quantum well epitaxial layers can be economically fabricated using the concepts of the invention.

Figure 1A:
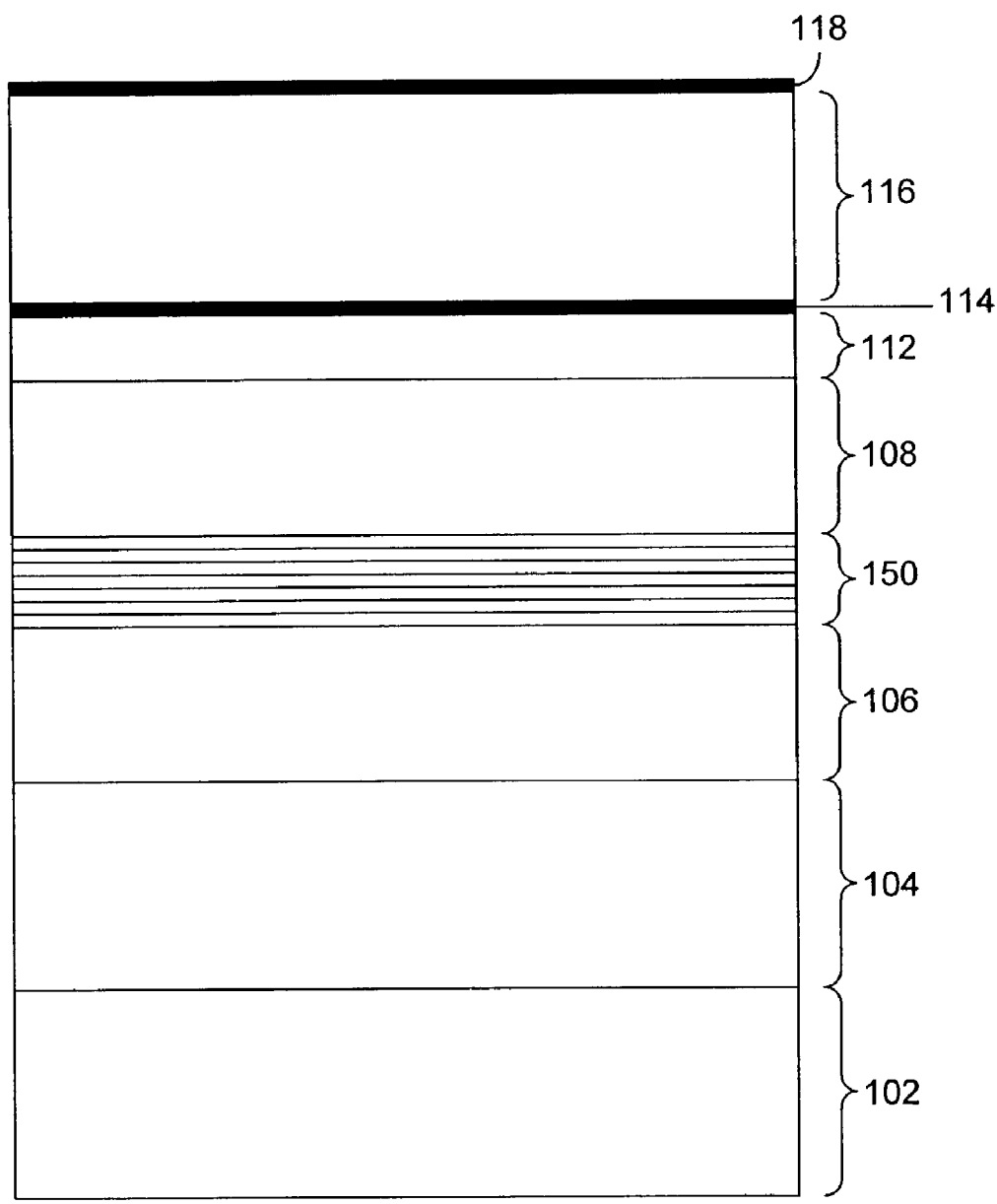
FIG. 1A is a schematic view illustrating the relevant portions of an exemplary edge emitting laser constructed in accordance with an aspect of the invention.

FIG. 1A is a schematic view illustrating the relevant portions of an exemplary edge emitting laser 100 constructed in accordance with an aspect of the invention. Some of the elements of the laser 100 are omitted for simplicity. The laser 100 comprises an N-type, sulfur (S) doped, indium phosphide (InP) substrate 102 over which an n-type 2 μm thick, selenium (Se) doped, InP cladding layer 104 is formed. The cladding layer 104 is formed using a high bandgap, low refractive index material.

A lower separate confinement heterostructure (SCH) layer 106 is formed over the cladding layer 104. The lower SCH layer 106 is preferably formed of a 120 nanometer (nm) thick layer of indium gallium arsenide phosphide (InGaAsP) having a bandgap wavelength of approximately 1.15 μm. The combination of the cladding layer 104 and the lower SCH layer 106 acts as a waveguide and provides optical confinement for the light generated in the active region to be described below. The composition of the lower SCH layer is preferably $In_{0.85}Ga_{0.15}As_{0.35}P_{0.65}$. The composition of the InGaAsP in the lower SCH layer is chosen to provide the desired optical confinement and carrier confinement properties.

In accordance with an aspect of the invention, an active region 150 comprising alternating indium arsenide phosphide (InAsP) quantum well layers and indium gallium phosphide (InGaP), or indium gallium arsenide phosphide (InGaAsP), barrier layers is then formed over the lower SCH layer 106. The InAsP quantum well layers and the InGaP barrier layers form a multiple quantum well (MQW) structure. As will be described in detail below, the InAsP quantum well layers and the InGaP barrier layers are grown in an OMVPE reactor at a low growth temperature. The low growth temperature minimizes the formation of dislocations in the quantum well layers and allows the operating wavelength of the laser 100 to be extended to the 1.5 μm range.

A 120 nm thick upper SCH layer 108 is formed over the active region 150. The upper SCH layer 108 is constructed similarly to the lower SCH layer 106. A p-type, 0.1 μm thick spacer layer 112 of zinc (Zn) doped InP is formed over the upper SCH layer 108. The spacer layer 112 defines the distance between the upper SCH layer 108 and an etch stop layer 114.

The etch stop layer 114 is formed using InGaAsP and is formed over the spacer layer 112. Preferably the etch stop layer 114 is approximately 20 nm thick. The etch stop layer 114 is used to stop an appropriate etchant at that layer if the formation of a ridge waveguide is desired.

A p-type 2 μm thick, Zn doped, InP cladding layer 116 is formed over the etch stop layer 114. The combination of the cladding layer 116 and the upper SCH layer 108 acts as a waveguide and provides optical confinement for the light generated in the active region 150. The cladding layers 104 and 116 are high bandgap, low refractive index material layers that confine carriers that are injected into the active region 150 and help to confine the light generated in the active region 150 to the upper and lower SCH layers 106 and 108.

A cap layer 118 comprising a 0.1 μm thick layer of Zn doped InGaAs is formed over the cladding layer 116 and provides good ohm contact between the cladding layer 116 and metal contacts (not shown).

In operation, when the laser 100 is forward biased, holes from the p-type material above the active region 150 and electrons from the n-type material below the active region 150 are launched into the active region, where they settle in the low bandgap InAsP quantum well layers (to be described below). In this manner, light is generated in the active region 150. The light is confined by the waveguide, which is formed by the MQW structure in the active region 150, and the upper and lower SCH layers 106 and 108, which are surrounded by the cladding layers 104 and 116, respectively.

In accordance with an embodiment of the invention, InAsP quantum well layers and InGaP barrier layers that are formed as part of the active region 150 are grown in an OMVPE reactor at a reduced temperature, as will be described below with particular reference to FIGS. 2A and 2B.

Figure 1B:
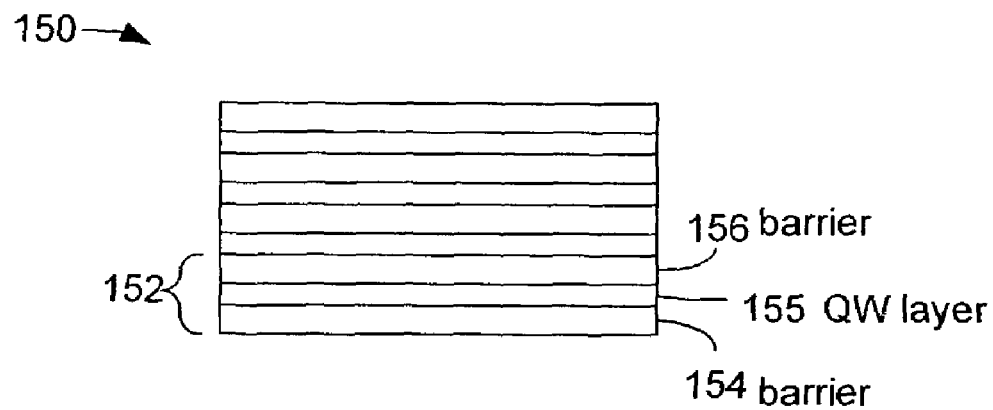
FIG. 1B is a schematic view illustrating the active region of the laser of FIG. 1A.

FIG. 1B is a schematic view illustrating the active region 150 of the laser 100 of FIG. 1A. As shown in FIG. 1B, the active region 150 includes a number of quantum wells, an exemplary one of which is illustrated using reference numeral 152.

The quantum well 152 includes a quantum well layer 155 sandwiched between two barrier layers 154 and 156. In a preferred embodiment, the quantum well layer 155 is $InAs_{0.6}P_{0.4}$ and is grown in a thickness of approximately 7.5 nm at a growth temperature of less than about 520 degrees C. The barrier layers 154 and 156 are each $InGa_{0.15}P_{0.85}$ and are grown in a thickness of approximately 12.5 nm at a growth temperature of less than about 520 degrees C. By growing the barrier layers 154 and 156 and the quantum well layer 155 at less than about 520 degrees C., the quantum well 152 can sustain a high level of strain without forming dislocations when the material layers relax.

Figure 1C:
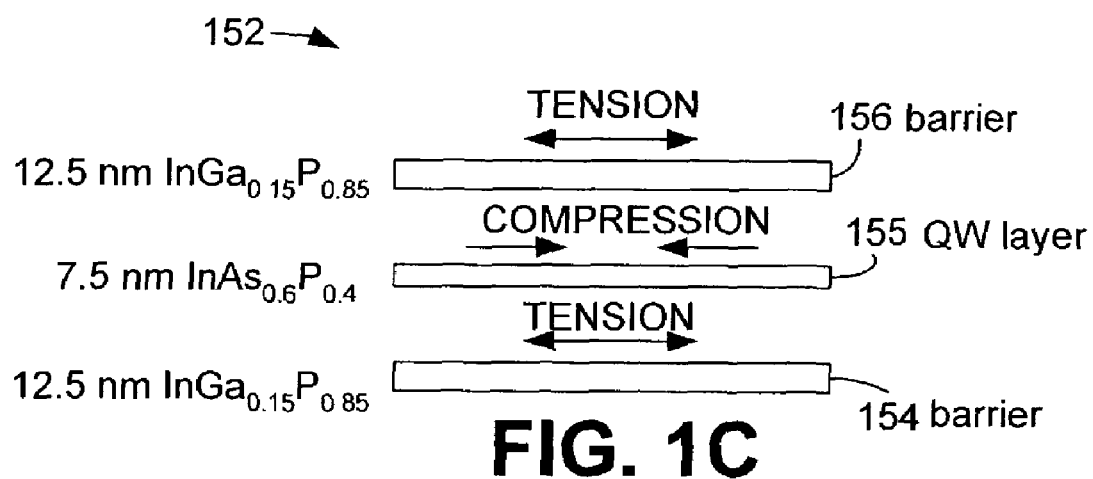
FIG. 1C is a schematic view illustrating the quantum well layer and associated barrier layers of FIG. 1B.

FIG. 1C is a schematic view illustrating the quantum well layer 155 and associated barrier layers 154 and 156 of FIG. 1B. The quantum well layer 155 is in a condition referred to as "compressive" strain with respect to the InP substrate 102 (FIG. 1A). The bulk lattice constant of the quantum well layer 155 is larger than the lattice parameter of the InP substrate 102 (FIG. 1A), so that when grown over the InP substrate 102, the quantum well layer 155 is compressively strained. The barrier layers 154 and 156 are in a condition referred to as "tensile" strain with respect to the InP substrate 102 (FIG. 1A). The bulk lattice constant of the barrier layers 154 and 156 is smaller than the lattice parameter of the InP substrate 102 (FIG. 1A), so that when grown over the InP substrate 102, the barrier layers 154 and 156 are in tensile strain. Accordingly, the tensile strain of the barrier layers 154 and 156 "balance" the compressive strain of the quantum well layer 155, resulting in what is referred to as a "strain balanced" condition. When a strain balanced quantum well 152 is grown at a lower than conventional temperature, the luminescence efficiency and the spectral linewidth (a measure of the optical quality of the laser 100) are excellent. Because it is desirable to have slightly less tensile strain in the barrier layers than compressive strain in the quantum well layers, the barrier layers 154 and 156 may be grown thicker than the quantum well layer 155.

The structure of the quantum well 152 allows very high energy band offset, which helps to reduce leakage current in the active region 150. For example, the bandgap energy ($E_g$) of the InAsP quantum well layer 155 is 0.73 electron volts (eV) ($\lambda$=1.7 μm) and the bandgap energy ($E_g$) of the InGaP barrier layer 154 is 1.45 eV ($\lambda$=0.85 μm). This results in a bandgap energy difference between the quantum well layer and the barrier layer of more than 600 millielectron Volts (meV), which is significantly higher than in conventional structures. The quantum well 155 exhibits a very high electron confinement barrier, which helps to eliminate carrier leakage in the laser 100 and leads to higher operating efficiency and a lower threshold current, due to a higher characteristic temperature, $T_0$ than an InGaAsP quantum well FIG. 2A is a schematic diagram 200 illustrating an OMVPE reactor 210 in which a laser including the active region 150 can be grown. Many of the details of an OMVPE reactor are omitted for clarity, as they are known in the art. A reactor controller 215 is coupled to the reactor 210 via connection 217. The reactor controller can control various operating aspects and parameters of the reactor 210. As will be described in greater detail below, the reactor controller 215 can be used to control, among other parameters, the temperature in the reactor 210 during epitaxial growth.

To facilitate OMVPE epitaxial growth, a carrier gas is bubbled through the constituent precursor compounds so that a saturated vaporous precursor is created for each compound. After the carrier gas is bubbled through the constituent precursor compounds, the saturated vaporous precursors are then diluted with other gasses as is known in the art. The vaporous precursors are transported into the reactor by the carrier gas. The vaporous precursors are pyrolized inside the reactor when they pass over a heated substrate wafer, yielding the constituent atomic elements. These elements are deposited on the heated substrate wafer, where they bond to the underlying crystal structure of the substrate wafer, thereby forming an epitaxial layer.

In the example shown in FIG. 2A, and to facilitate the growth of an InAsP quantum well layer and an InGaP barrier layer, the vaporous precursors 214 may include arsine ($AsH_3$), the arsenic precursor, phosphine ($PH_3$), the phosphorus precursor, trimethylgallium (TMGa), the gallium precursor, trimethylindium (TMIn), the indium precursor, and a carrier gas. Trimethylgallium is also known in the art as an alkyl-gallium, which has the chemical formula $(CH_3)_3Ga$, and trimethylindium is also known in the art as an alkyl-indium, which has the chemical formula $(CH_3)_3In$.

Other vaporous precursors can also be used depending on the desired composition of the epitaxial layers. The carrier gas can be, for example, hydrogen ($H_2$) or nitrogen ($N_2$). The carrier gas is bubbled through these chemical precursors. These flows are subsequently combined into a vaporous mixture of the appropriate concentrations, and carried into the OMVPE reactor 210.

To achieve optimum layer thickness, composition uniformity and interface abruptness, additional carrier gas may be introduced to increase the flow velocity. A heated susceptor 212 comprises a heated surface (typically graphite, silicon carbide, or molybdenum) on which a crystalline substrate 102 resides. The cladding layer 110, lower SCH layer 106, active region 150, including barrier layers alternating with quantum well layers, the upper SCH layer 108, the spacer layer 112, the etch stop layer 114, the cladding layer 116 and the cap layer 118 are grown over the crystalline substrate 102 and form the laser 100 (FIG. 1A).

In accordance with the operation of an OMVPE reactor 210, the vaporous precursors travel into the OMVPE reactor, as indicated using arrow 216, and eventually pass over the heated substrate 102. As the vaporous precursors pass over the heated substrate 220, they are decomposed by pyrolysis and/or surface reactions, thereby releasing the constituent species on the substrate surface. These species settle on the heated surface of the substrate 102, where they bond to the underlying crystal structure. In this manner, epitaxial growth occurs in the OMVPE reactor 210.

Figure 2B:
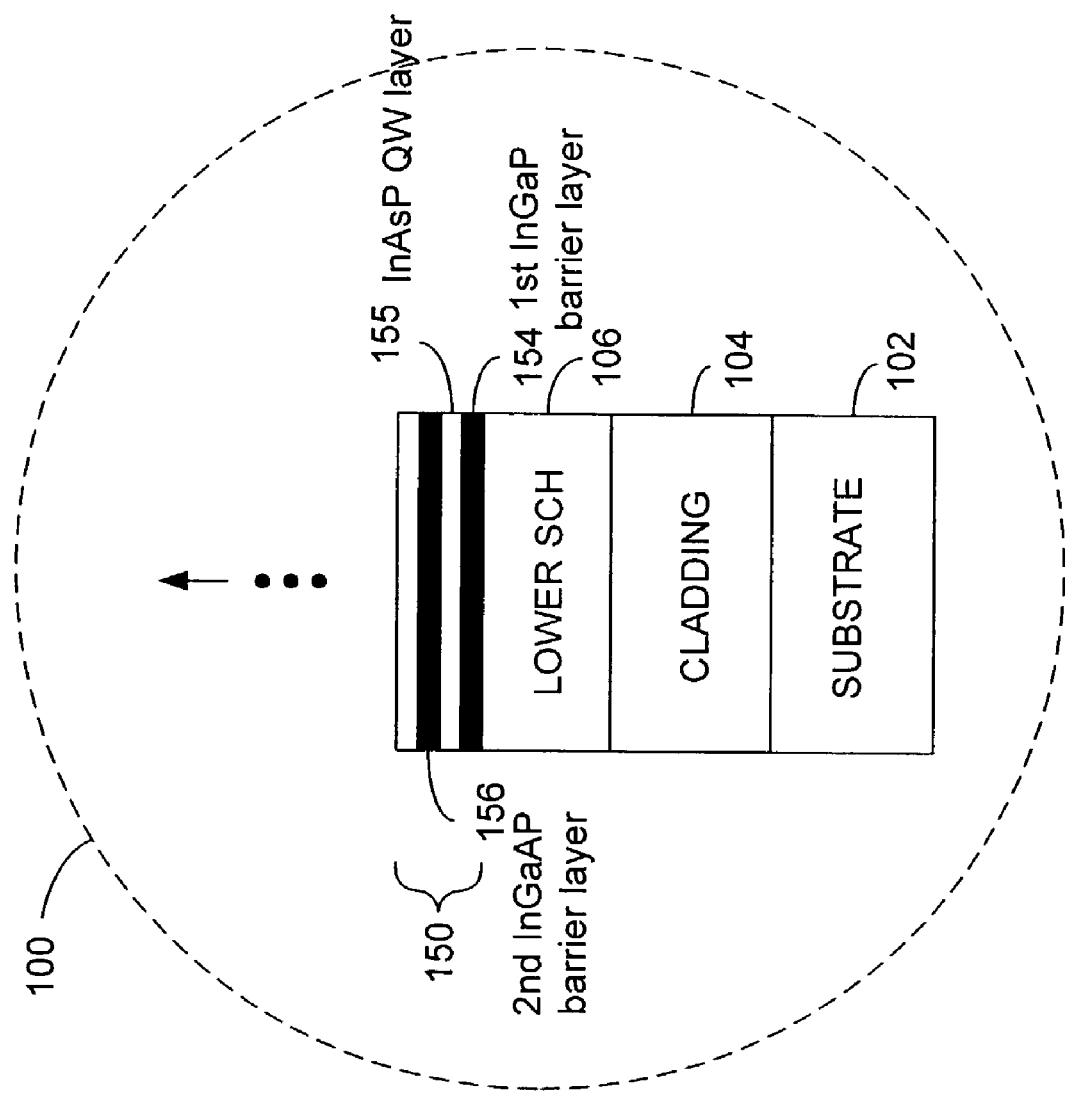
FIG. 2B is a detailed view of the laser shown in FIG. 2A partway through the fabrication process.

FIG. 2B is a detailed view of the laser 100 shown in FIG. 2A partway through the fabrication process. The epitaxial layers that form the laser 100 are deposited using OMVPE. In accordance with an embodiment of the invention, and to grow an active region including InAsP quantum wells, the temperature in the OMVPE reactor 210 is maintained at or below approximately 520 degrees C. during the growth of the InGaP barrier layers and the InAsP quantum well layers, while the reactor 210 is maintained at a temperature of approximately 610 to 640 degrees C. when the other layers are grown. This results in fewer dislocations by suppressing relaxation of the layers.

Lowering the temperature in the OMVPE reactor 210 ensures that the InAsP material in the quantum well layers and the InGaP material in the barrier layers are of high optical quality and emit light in the 1.5 nm wavelength range.

As shown in FIG. 2B, a first InGaP barrier layer 154 is grown over the lower SCH layer 106. Alternatively, the barrier layer 154 can be formed using InGaAsP, which may provide improved control of the bandgap and strain in the quantum well 152.

Although the lower SCH layer 106 is formed using InGaAsP, this layer would not function as a first barrier layer. In a preferred embodiment, the lower SCH layer would be formed using $In_{0.85}Ga_{0.15}As_{0.35}P_{0.65}$ while the first barrier layer would be formed using $In_{0.8}Ga_{0.2}As_{0.1}P_{0.9}$ if InGaAsP were used. These different material compositions are used because of the different strain and bandgap requirements of the lower SCH layer 106 and the barrier layer 154.

Figure 3:
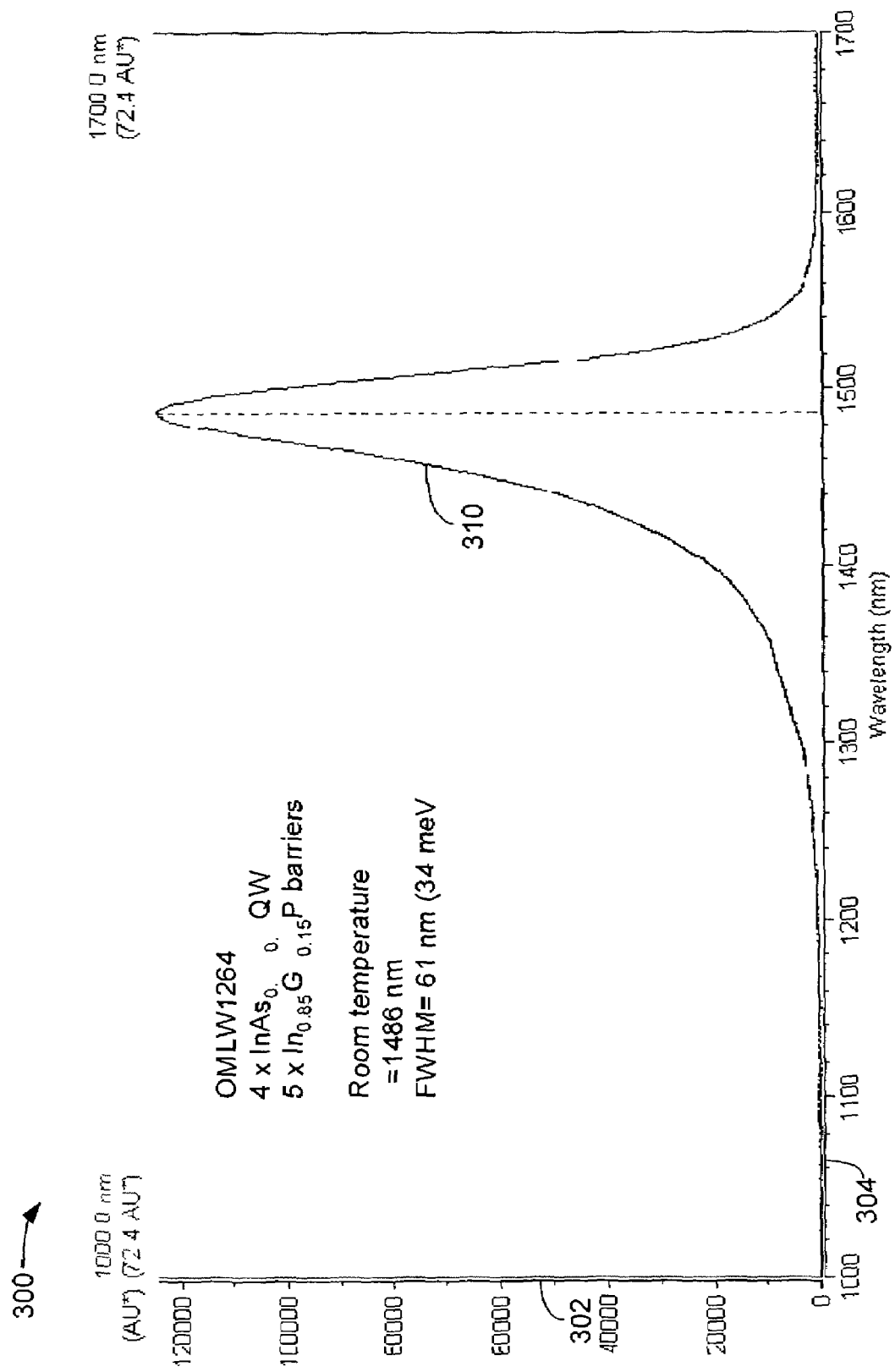
FIG. 3 is a graphical illustration depicting the room temperature photoluminescence intensity obtained from a 1.5 μm InAsP quantum well layer-InGaP barrier layer active region structure of FIG. 1B.

FIG. 3 is a graphical illustration 300 depicting the room temperature photoluminescence obtained from an InAsP quantum well layer-InGaP barrier layer active region 150 of FIG. 1B structured to generate light at approximately 1.5 µm. The vertical axis 302 represents photoluminescence intensity and the horizontal axis 304 represents wavelength (λ) in nanometers (nm). The curve 310 represents significant photoluminescence centered at a wavelength of 1,486 nm, with a full width half maximum (FWHM) value of 61 nm (34 meV). From the graphical illustration 300 it is clear that, at room temperature, a high quality 1.5 µm multiple quantum well structure can be grown as described above with respect to FIGS. 2A and 2B.

Figure 4:
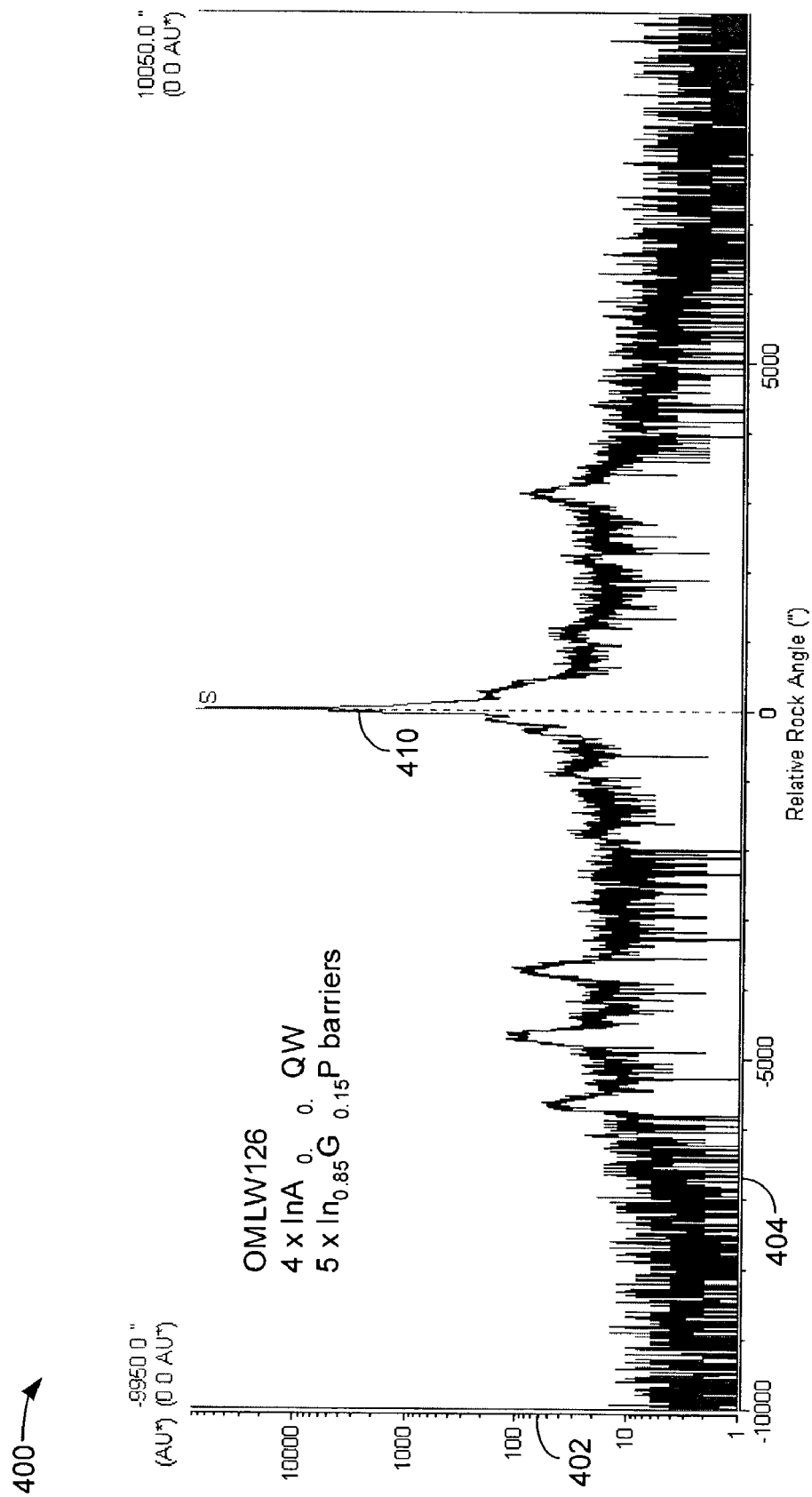
FIG. 4 is a graphical illustration showing the x-ray diffraction analysis for an InAsP quantum well layer-InGaP barrier layer active region of FIG. 1B.

FIG. 4 is a graphical illustration 400 showing the x-ray diffraction analysis for an InAsP quantum well layer-InGaP barrier layer active region 150 of FIG. 1B. The vertical axis 402 represents diffracted intensity and the horizontal axis 404 represents relative rock angle, also known as diffraction angle. As shown, the curve 410 illustrates a superior multiple quantum well structure grown as described above in FIGS. 2A and 2B.

It will be apparent to those skilled in the art that many modifications and variations may be made to the preferred embodiments of the present invention, as set forth above, without departing substantially from the principles of the present invention. For example, many light emitting devices can benefit from the economical growth of an InAsP quantum well active region. The InAsP active region, including InAsP quantum well layers can be used in edge-emitting as well as surface-emitting lasers. All such modifications and variations are intended to be included herein within the scope of the present invention, as defined in the claims that follow.

What is claimed is:

1. A method for producing an active region for a long wavelength light emitting device, the method comprising:
    placing a substrate in an organometallic vapor phase epitaxy (OMVPE) reactor, the substrate for supporting growth of an indium arsenide phosphide (InAsP) film;
    forming a quantum well layer of InAsP; and
    forming a barrier layer adjacent the quantum well layer, where the quantum well layer and the barrier layer are formed at a temperature of less than 520 degrees C.

2. The method of claim 1, further comprising forming the quantum well layer of InAsP using a mole fraction of $InAs_{0.6}P_{0.4}$.

3. The method of claim 1, further comprising using indium gallium phosphide (InGaP) to form the barrier layer.

4. The method of claim 3, further comprising forming the barrier layer using a mole fraction of $In_{0.85}Ga_{0.15}P$.

5. The method of claim 1, further comprising using indium gallium arsenide phosphide (InGaAsP) to form the barrier layer.

6. The method of claim 5, further comprising forming the barrier layer using a mole fraction of $In_{0.8}Ga_{0.2}As_{0.1}P_{0.9}$.

7. A method for producing a long wavelength light emitting device using organometallic vapor phase epitaxy (OMVPE), comprising:
    providing a substrate in an OMVPE reactor;
    growing a first cladding layer of indium phosphide (InP);
    growing a lower separate confinement heterostructure (SCH) layer of InGaAsP;
    growing an active region comprising alternating layers of InGaP barrier layers and InAsP quantum well layers, the InGaP barrier layers and the InAsP quantum well layers grown at a temperature of less than 520 degrees C.;
    growing an upper SCH layer of InGaAsP;
    growing an etch stop layer of InP;
    growing a second cladding layer of indium phosphide (InP); and
    growing a cap layer of InGaAs.

8. The method of claim 7, further comprising growing the quantum well layer of InAsP using a mole fraction of $InAs_{0.6}P_{0.4}$.

9. The method of claim 7, further comprising using indium gallium phosphide (InGaP) to form the barrier layer.

10. The method of claim 9, further comprising growing the barrier layer using a mole fraction of $In_{0.85}Ga_{0.15}P$.

11. The method of claim 7, further comprising using indium gallium arsenide phosphide (InGaAsP) to form the barrier layer.

12. The method of claim 11, further comprising forming the barrier layer using a mole fraction of $In_{0.8}Ga_{0.2}As_{0.1}P_{0.9}$.

* * * * *